(12) United States Patent
Wang

(10) Patent No.: US 11,961,881 B2
(45) Date of Patent: Apr. 16, 2024

(54) METHOD FOR FORMING SEMICONDUCTOR STRUCTURE AND SEMICONDUCTOR STRUCTURE

(71) Applicant: CHANGXIN MEMORY TECHNOLOGIES, INC., Anhui (CN)

(72) Inventor: Lingxiang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 345 days.

(21) Appl. No.: 17/445,993

(22) Filed: Aug. 26, 2021

(65) Prior Publication Data
US 2022/0052150 A1 Feb. 17, 2022

Related U.S. Application Data

(63) Continuation of application No. PCT/CN2021/098928, filed on Jun. 8, 2021.

(30) Foreign Application Priority Data

Aug. 13, 2020 (CN) .......................... 202010813668.3

(51) Int. Cl.
H10B 12/00 (2023.01)
H01L 23/522 (2006.01)
H01L 49/02 (2006.01)

(52) U.S. Cl.
CPC .............. *H01L 28/91* (2013.01); *H01L 28/92* (2013.01); *H10B 12/00* (2023.02)

(58) Field of Classification Search
CPC ......... H01L 28/90; H01L 28/91; H01L 28/92; H01L 23/5223; H10B 12/00; H10B 12/033
See application file for complete search history.

(56) References Cited

U.S. PATENT DOCUMENTS

| 10,355,002 | B2 | 7/2019 | Sills | |
|---|---|---|---|---|
| 10,622,363 | B2 | 4/2020 | Sills | |
| 2009/0212338 | A1* | 8/2009 | Benson | H10B 12/033 257/306 |
| 2010/0295110 | A1* | 11/2010 | Takaishi | H10B 12/033 257/E27.084 |
| 2015/0221718 | A1* | 8/2015 | Rhie | H01L 28/90 438/386 |

(Continued)

FOREIGN PATENT DOCUMENTS

| CN | 101609795 A | 12/2009 |
|---|---|---|
| CN | 205956089 U | 2/2017 |

(Continued)

*Primary Examiner* — Omar F Mojaddedi
(74) *Attorney, Agent, or Firm* — Syncoda LLC; Feng Ma

(57) ABSTRACT

A method for forming a semiconductor structure includes providing a semiconductor substrate, which at least includes discrete conducting layers in the semiconductor substrate; forming discretely arranged supporting structures on the semiconductor substrate, capacitor openings being included between the supporting structures; forming lower electrodes on sidewalls of the supporting structures, the lower electrodes being electrically connected with the conducting layers; forming a capacitor dielectric layer covering tops of the supporting structures, sidewalls of the lower electrodes, and bottoms of the capacitor openings; and forming an upper electrode covering the capacitor dielectric layer, to form capacitor structures.

13 Claims, 19 Drawing Sheets

(56) References Cited

U.S. PATENT DOCUMENTS

| | | | |
|---|---|---|---|
| 2018/0061840 A1* | 3/2018 | Sills | H01L 28/90 |
| 2018/0197864 A1* | 7/2018 | Sills | H10B 12/033 |
| 2019/0081134 A1* | 3/2019 | Chang | H01L 28/92 |
| 2019/0296023 A1 | 9/2019 | Sills | |
| 2020/0219886 A1 | 7/2020 | Sills | |

FOREIGN PATENT DOCUMENTS

| | | |
|---|---|---|
| CN | 107799523 A | 3/2018 |
| CN | 107895721 A | 4/2018 |
| CN | 107301976 B | 5/2018 |
| CN | 208189581 U | 12/2018 |
| CN | 109148427 A | 1/2019 |
| CN | 110192280 A | 8/2019 |
| CN | 110957303 A | 4/2020 |
| CN | 110957317 A | 4/2020 |
| CN | 110970401 A | 4/2020 |

\* cited by examiner

METHOD FOR FORMING SEMICONDUCTOR STRUCTURE AND SEMICONDUCTOR STRUCTURE

CROSS-REFERENCE TO RELATED APPLICATIONS

This application is a continuation of International Application No. PCT/CN2021/098928 filed on Jun. 8, 2021, which claims priority to Chinese Patent Application No. 202010813668.3 filed on Aug. 13, 2020. The disclosures of these applications are hereby incorporated by reference in their entirety.

BACKGROUND

With the constant reduction of feature sizes of Dynamic Random Access Memories (DRAMs), sizes of formed capacitors are also constantly reduced, and high-aspect-ratio capacitors are required to be formed to ensure capacitance of the capacitors. At present, capacitance of capacitors is increased mainly by forming double-sided capacitors. In a process of forming a high-aspect-ratio double-sided capacitor, a high-aspect-ratio capacitor hole is required to be formed by etching to form a hollow capacitance column.

SUMMARY

The disclosure relates to the field of semiconductors, and particularly to a semiconductor structure forming method and a semiconductor structure.

The disclosure provides a method for forming a semiconductor structure, which includes the following operations. A semiconductor substrate is provided. The semiconductor substrate at least includes discrete conducting layers in the semiconductor substrate. Discretely arranged supporting structures are formed on the semiconductor substrate. The supporting structures include capacitor openings between the supporting structures. Lower electrodes are formed on sidewalls of the supporting structures. The lower electrodes are electrically connected with the conducting layers. A capacitor dielectric layer covering tops of the supporting structures, sidewalls of the lower electrodes, and bottoms of the capacitor openings is formed. And an upper electrode covering the capacitor dielectric layer is formed, to form capacitor structures.

The disclosure also provides a semiconductor structure, which includes: a semiconductor substrate, in which at least discrete conducting layers are included; multiple discrete supporting structures, located on the semiconductor substrate; and capacitor structures supported by the supporting structures. A capacitor structure includes: a lower electrode, which is located on a sidewall of each supporting structure and electrically connected with a conducting layer; a capacitor dielectric layer, which is located at a top of the supporting structure, a sidewall of the lower electrode, and a bottom of a gap between the supporting structures; and an upper electrode, which located on the capacitor dielectric layer.

DETAILED DESCRIPTION

In a process of forming a double-sided capacitor, if an aspect ratio of the formed double-sided capacitor is relatively high, when a hollow capacitance column is formed by etching, a capacitor structure is instable and likely to collapse, and inner-layer capacitance of the double-sided capacitor is electrically instable, such that the yield of a semiconductor structure is affected.

In order to solve the foregoing problem, an example of the disclosure provides a method for forming a semiconductor structure, and the method includes the following operations. A semiconductor substrate is provided. The semiconductor substrate at least includes discrete conducting layers in the semiconductor substrate. Discretely arranged supporting structures are formed on the semiconductor substrate. The supporting structures include capacitor openings between the supporting structures. A lower electrode is formed on a sidewall of each supporting structure. The lower electrode is electrically connected with a corresponding conducting layer. A capacitor dielectric layer covering a top of the supporting structure, a sidewall of the lower electrode, and a bottom of the capacitor opening is formed. An upper electrode covering the capacitor dielectric layer is formed, to form a capacitor structure.

In order to make the objectives, technical solutions, and advantages of the examples of the disclosure clearer, each example of the disclosure will be described below in detail in combination with the drawings. However, those of ordinary skill in the art can understand that, in each example of the disclosure, many technical details are proposed to make readers understand the disclosure better. However, the technical solutions claimed by the disclosure may also be implemented even without these technical details and various variations and modifications made based on each of the following examples. Division of each of the following examples is for ease of description and should not form any limit to specific implementation modes of the disclosure. Each example can be combined and refer to each other without conflicts.

FIG. 1 to FIG. 11 are flowcharts corresponding to each step of a method for forming a semiconductor structure according to an example of the disclosure. The method for forming a semiconductor structure of the example will be specifically described below.

It is to be noted that specific introductions are made in the example taking a semiconductor structure in a memory as an example. That is, in the example, a semiconductor structure to be protected is formed in a DRAM or a static random access memory (SRAM).

Figure 1:
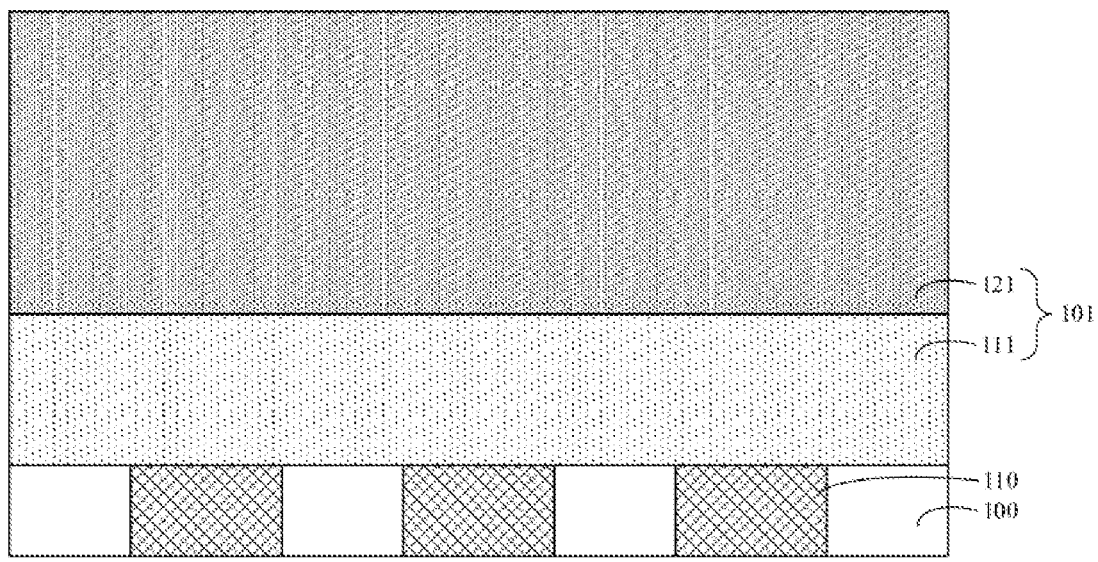
FIG. 1 is a first sectional structure diagram of a semiconductor structure corresponding to a step of a method for forming a semiconductor structure according to an embodiment of the disclosure.
Figure 6:
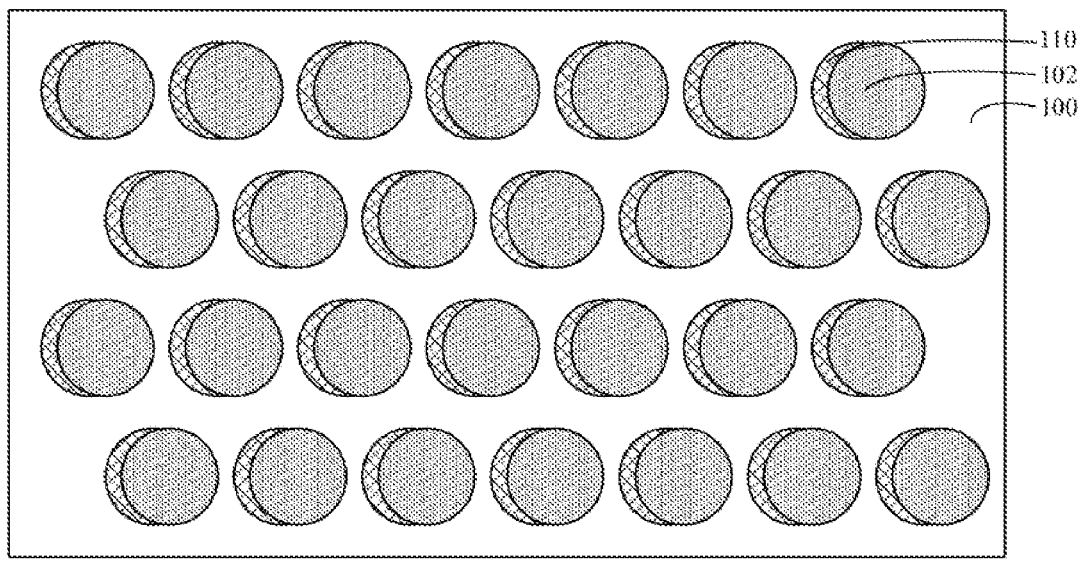
FIG. 6 is a sixth sectional structure diagram of a semiconductor structure corresponding to a step of a method for forming a semiconductor structure according to an embodiment of the disclosure.

Referring to FIG. 1 and FIG. 6, a semiconductor substrate 100 is provided, and discretely arranged supporting structures 102 are formed on the semiconductor substrate 100.

Referring to FIG. 1, at least discrete conducting layers 110 are included in the semiconductor substrate 100.

Figure 2:
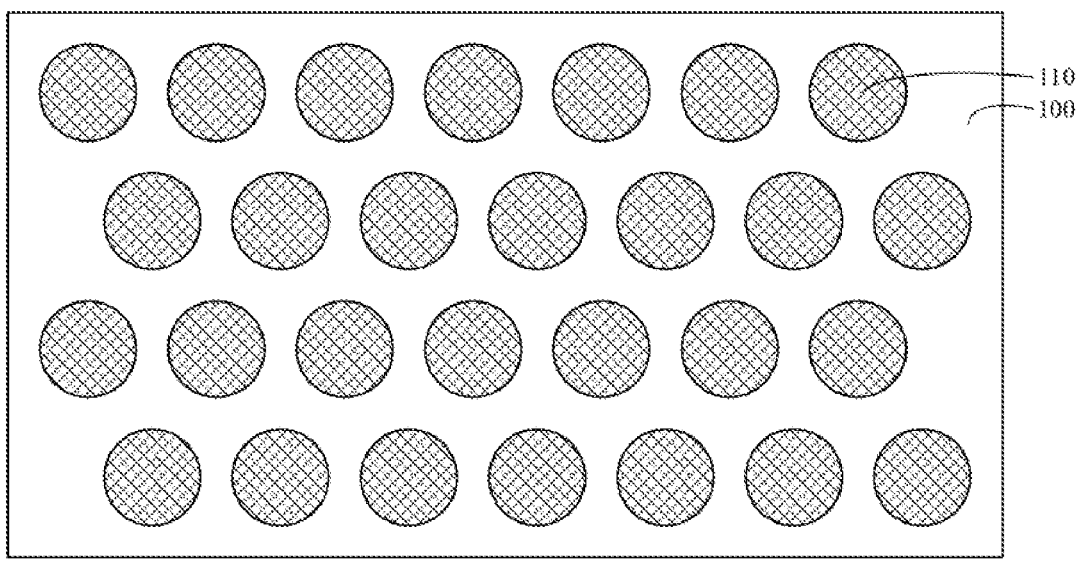
FIG. 2 is a second sectional structure diagram of a semiconductor structure corresponding to a step of a method for forming a semiconductor structure according to an embodiment of the disclosure.

An arrangement of the discrete conducting layers 110 in the semiconductor substrate 100 is shown in FIG. 2. The conducting layer 100 is a landing pad in a DRAM structure. The conducting layers 110 are arranged hexagonally and configured to electrically connect to array transistors of the DRAM.

Referring back to FIG. 1, a supporting layer 101 is formed on the semiconductor substrate 100. The supporting layer 101 is configured to subsequently form supporting structures 102 by etching.

In this example, the supporting layer 101 includes a bottom supporting layer 111 and filling layer 121 that are formed by sequentially stacking. Through the supporting layer 101 formed by sequentially stacking, formation of a supporting layer 101 with a relatively great thickness by a single deposition is avoided, and higher density of the formed supporting layer 101 is ensured. The supporting layer 101 is formed by sequentially stacking, so that it is ensured that the whole supporting structure 102 that is subsequently formed is relatively high, and an aspect ratio of a subsequently formed columnar capacitor is increased. In addition, in the example, the bottom supporting layer 111 and the filling layer 121 are formed with different insulating materials.

It should be noted that the supporting layer 101 is implemented by utilizing the bottom supporting layer 111 and the filling layer 121, which is only for illustration that the supporting layer 101 provided in the example may be implemented by a mode of a stacked structure. Thicknesses of the bottom supporting layer 111 and the filling layer 121 are not limited in the example. In another example, the supporting layer may also be implemented by a single-layer structure, namely the subsequently formed supporting structure is a single-layer structure. Alternatively, the supporting layer may be implemented by a stacked structure of three layers or more than three layers, and the stacked structure formed in such a manner is higher, namely the subsequently formed supporting structure 102 is higher.

Referring to FIG. 3 to FIG. 6, the supporting layer 101 is patterned to form capacitor openings 103, and the remaining supporting layer 101 forms supporting structures 102.

Figure 3:
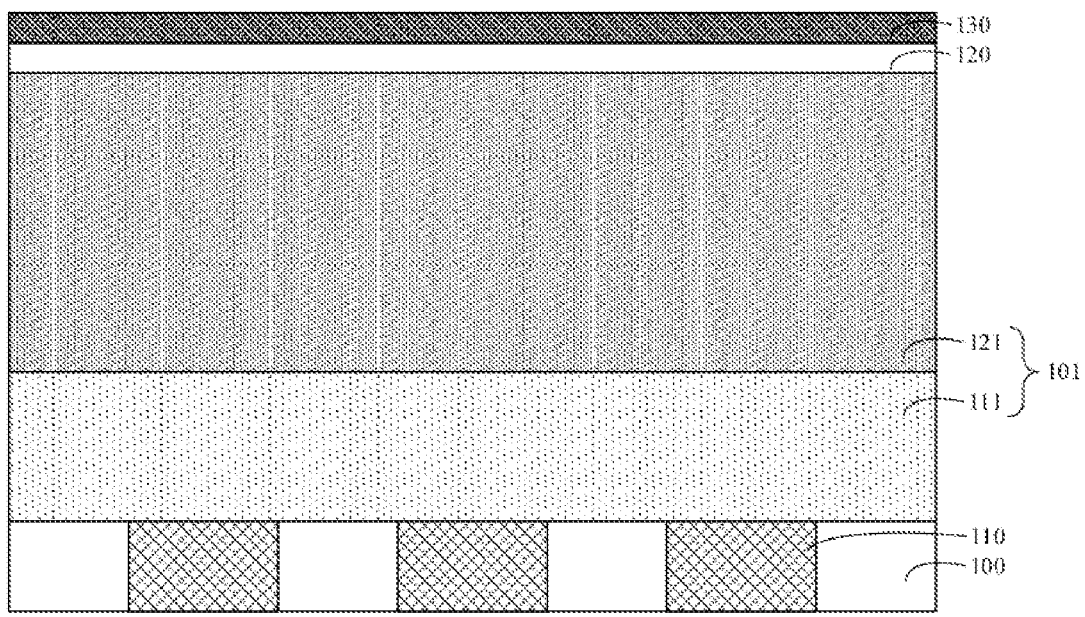
FIG. 3 is a third sectional structure diagram of a semiconductor structure corresponding to a step of a method for forming a semiconductor structure according to an embodiment of the disclosure.

Referring to FIG. 3, a mask layer 120 and a patterned photoresist layer 130 are sequentially formed on the supporting layer 101.

Figure 4:
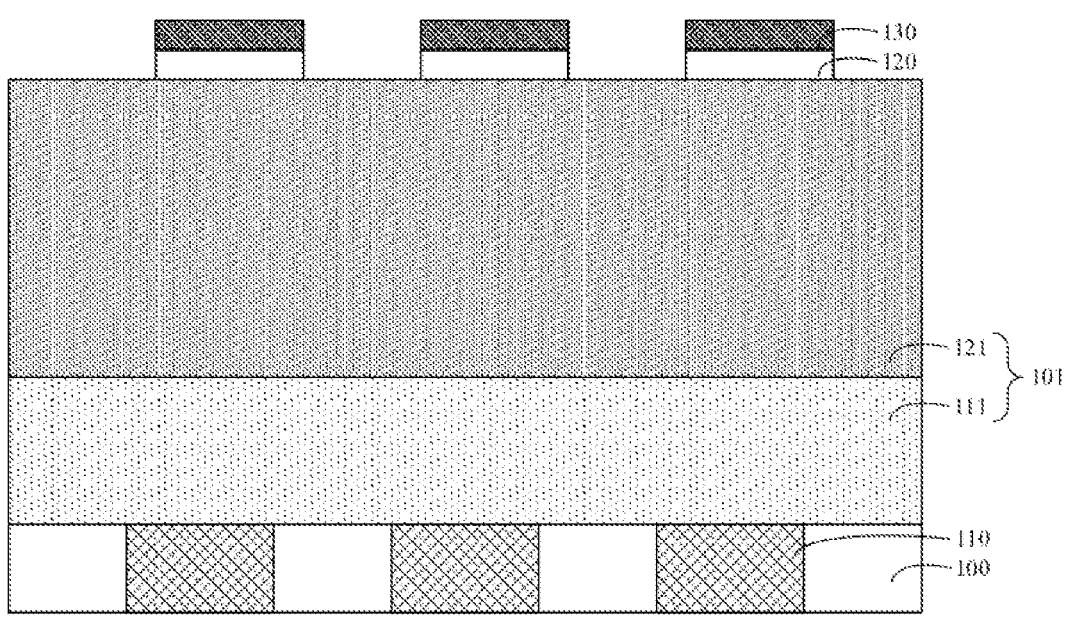
FIG. 4 is a fourth sectional structure diagram of a semiconductor structure corresponding to a step of a method for forming a semiconductor structure according to an embodiment of the disclosure.

Referring to FIG. 4, the mask layer 120 is patterned based on the patterned photoresist layer 130.

Figure 5:
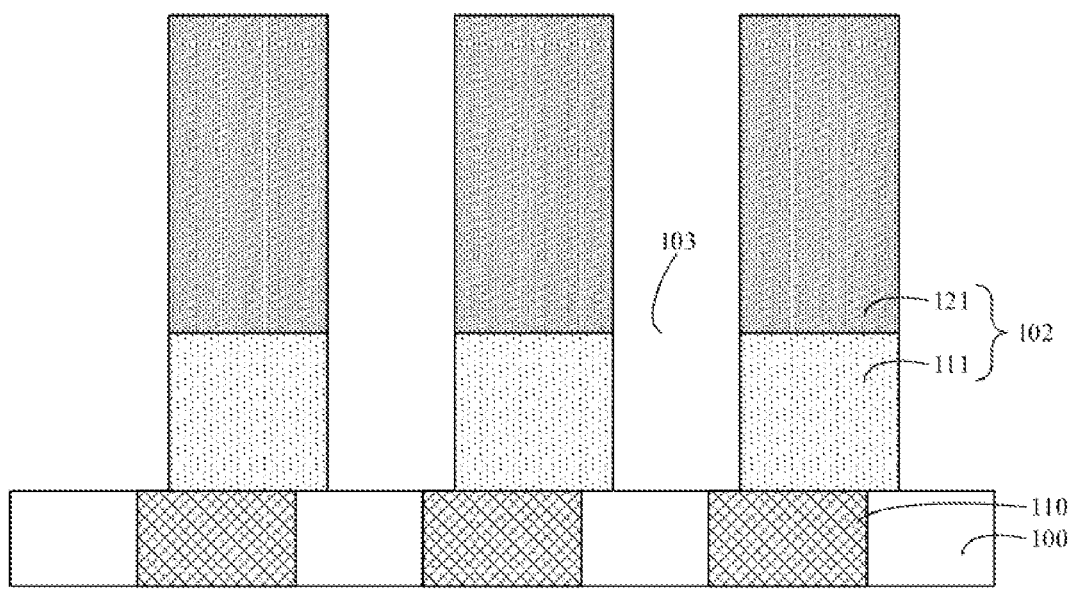
FIG. 5 is a fifth sectional structure diagram of a semiconductor structure corresponding to a step of a method for forming a semiconductor structure according to an embodiment of the disclosure.

Referring to FIG. 5, the supporting layer 101 is etched based on the patterned mask layer 120 to form the capacitor openings 103.

In the example, the capacitor opening 103 at least exposes a part of a top surface of each discrete conducting layer 110. In the example, a morphological distribution of the capacitor openings 103 and tops of the conducting layers 110 is shown in FIG. 6. The supporting layer 101 reserved after the capacitor openings 103 are etched forms the supporting structures 102. That is, in the example, the supporting structure 102 is a stacked structure formed by sequentially stacking, and the stacked structure includes a bottom supporting layer 111 and filling layer 121 that are formed by sequentially stacking.

After the capacitor openings 103 are formed by etching, the following operation is further included: the photoresist layer 130 and the mask layer 120 are sequentially removed.

Specifically, the photoresist layer 130 is removed by a first dry cleaning process. A mixed gas of ammonia, nitrogen, and hydrogen is adopted for the first dry cleaning process. The mixed gas reacts with the photoresist layer 130 to generate a first solid. Then, the first solid is evaporated in a high-temperature evaporation manner to complete removal of the photoresist layer 130.

It is to be noted that, in this example, when the mixed gas of ammonia, nitrogen, and hydrogen reacts with the photoresist layer 130 to generate the first solid, since the mixed gas is oxygen-free, and the supporting structure 102 is prevented from contacting with the air, natural oxidation of a sidewall of the supporting structure 102 is prevented at the same time of removing the photoresist layer 130.

After the photoresist layer 130 is removed, the mask layer 120 is removed by a first wet cleaning process. A mixed solution of 49% HF and 1:1:60 APM ($H_2O_2:NH_4OH:H_2O=1:1:60$) is adopted for the first wet cleaning process. The mixed solution reacts chemically with the mask layer 120 to remove the mask layer 120.

It is to be noted that, in this example—when the mixed solution of 49% HF and 1:1:60 APM reacts with the mask layer 120 to remove the mask layer 120, since the mixed solution contains $NH_4OH$, $OH^-$ may be ionized, and a particulate on the sidewalls of the supporting structures 102 may be removed by the repulsion of a negative charge of $OH^-$ and the oxidation property of $H_2O_2$.

Referring to FIG. 7 to FIG. 11, a capacitor structure 107 is formed based on the supporting structure 102.

Figure 7:
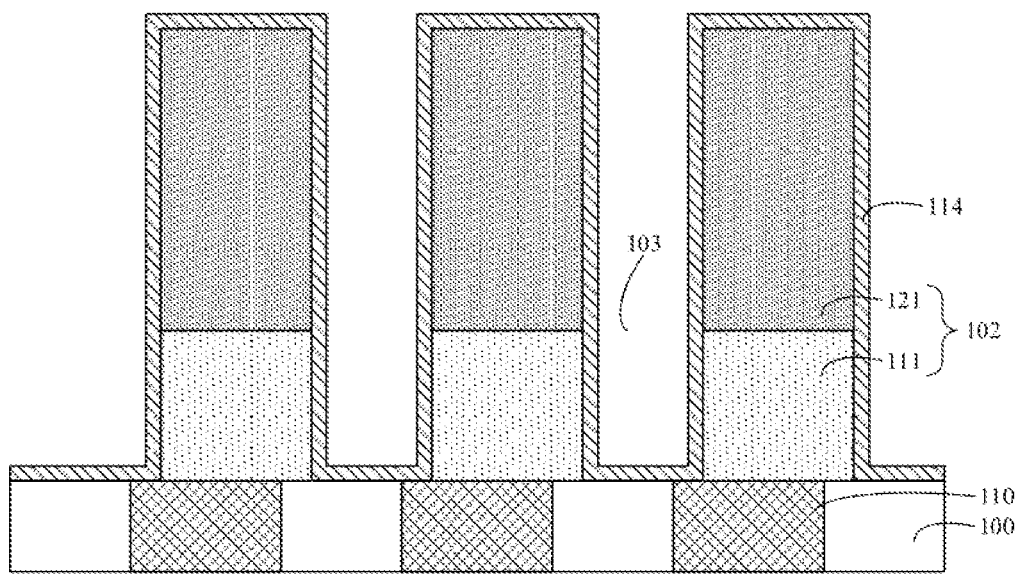
FIG. 7 is a seventh sectional structure diagram of a semiconductor structure corresponding to a step of a method for forming a semiconductor structure according to an embodiment of the disclosure.
Figure 8:
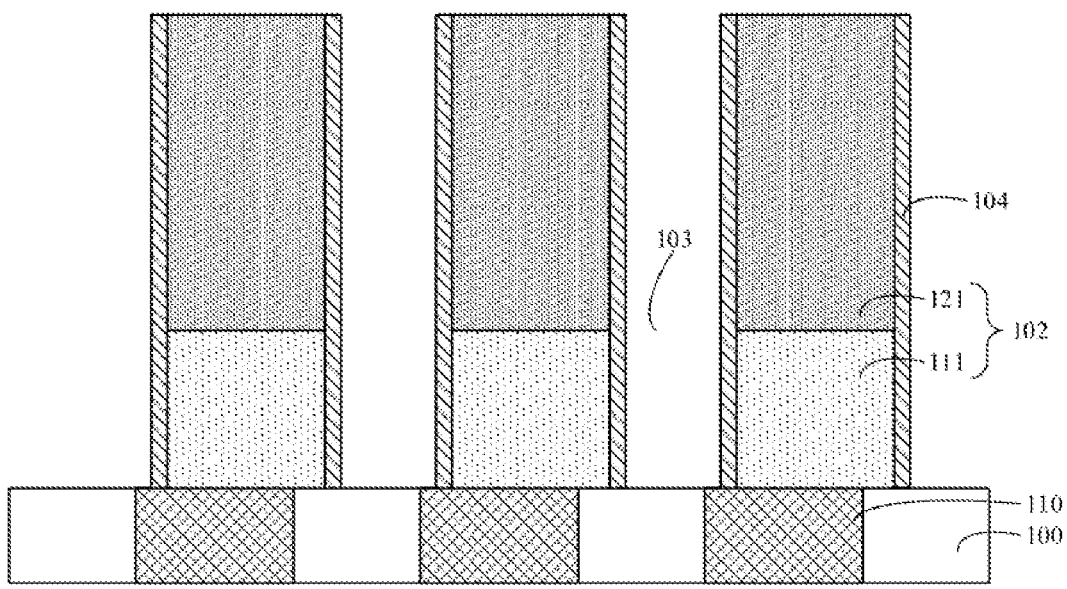
FIG. 8 is an eighth sectional structure diagram of a semiconductor structure corresponding to a step of a method for forming a semiconductor structure according to an embodiment of the disclosure.

Specifically, referring to FIG. 7 to FIG. 8, a lower electrode 104 is formed on a sidewall of the supporting structure 102. The lower electrode 104 is electrically connected with the conducting layer 110.

The lower electrode 104 may be a conducting layer or formed by multiple conducting materials, for example, doped polysilicon, titanium, titanium nitride, tungsten, and a composite of tungsten. In the example, a titanium nitride material is adopted for the lower electrode 104.

Referring to FIG. 7, a top conducting layer 114 is formed on the top and sidewall of each supporting structure 102 and a bottom of each capacitor opening 103.

Specifically, the top conducting layer 114 is formed by an atomic layer deposition process or a chemical vapor deposition method. In the example, the top conducting layer 114 is formed by the atomic layer deposition process, and the top conducting layer 114 formed by the atomic layer deposition process is good in coverage. In another example, for example, the top conducting layer may be formed by performing chemical vapor deposition below 500° C. or 600° C.

It is to be noted that the above exemplary description of a specific temperature parameter of chemical vapor deposition is only for ease of understanding of those skilled in the art and not intended to form limits to the solution. In practical applications, all parameters in the abovementioned range shall fall within the scope of protection of the disclosure.

Referring to FIG. 8, the top conducting layer 114 on the top of the supporting structure 102 and the bottom of the capacitor opening 103 is removed to form the lower electrode 104 on the sidewall of the supporting structure 102.

Specifically, a process for removing the top conducting layer 114 on the top of the supporting structure 102 includes chemical mechanical polishing. The chemical mechanical polishing process for removing the top conducting layer 114 of the supporting structure is simple in flow and low in cost, and the manufacturing efficiency of the capacitor structure may be improved effectively. In another example, the top conducting layer may also be planarized by etching.

Figure 9:
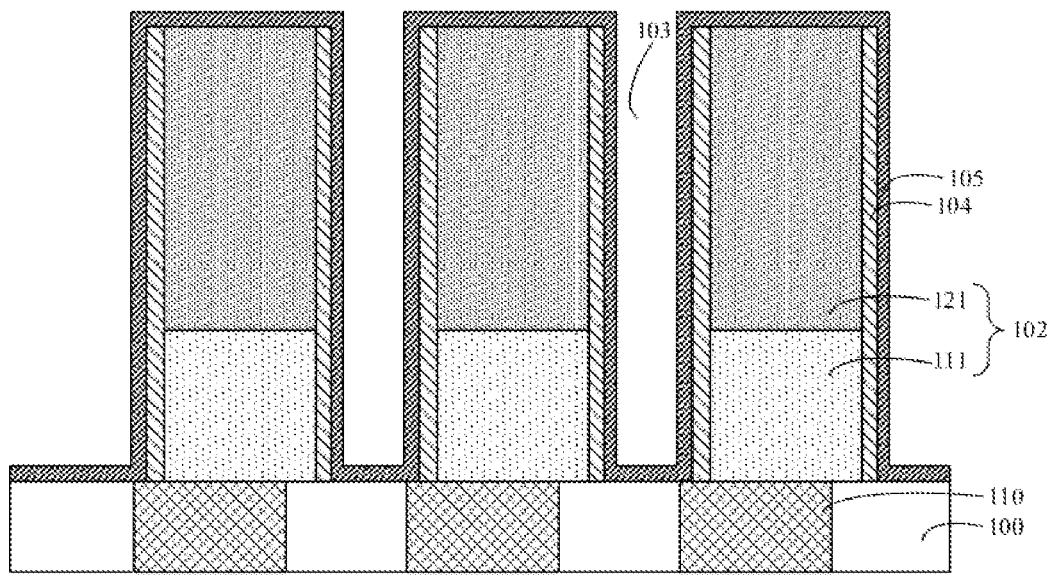
FIG. 9 is a ninth sectional structure diagram of a semiconductor structure corresponding to a step of a method for forming a semiconductor structure according to an embodiment of the disclosure.

Referring to FIG. 9, a capacitor dielectric layer 105 covering the top of the supporting structure 102, a sidewall of the lower electrode 104, and the bottom of the capacitor opening 103 is formed.

The capacitor dielectric layer 105 is a material with a high dielectric constant, for example, an element with a high dielectric constant like Hf, La, Ti, and Zr or an oxide thereof, or a dopant of Si and N may be adopted.

Specifically, the capacitor dielectric layer 105 is formed by the atomic layer deposition process or the chemical vapor deposition method. In the example, the capacitor dielectric layer 105 is formed by the atomic layer deposition process, and the capacitor dielectric layer 105 formed by the atomic layer deposition process is good in coverage. In another example, for example, the capacitor dielectric layer may be formed by performing chemical vapor deposition below 500° C. or 600° C.

It is to be noted that the above exemplary description of a specific temperature parameter of chemical vapor deposition is only for ease of understanding of those skilled in the art and not intended to form limits to the solution. In practical applications, all parameters in the abovementioned range shall fall within the scope of protection of the disclosure.

Figure 10:
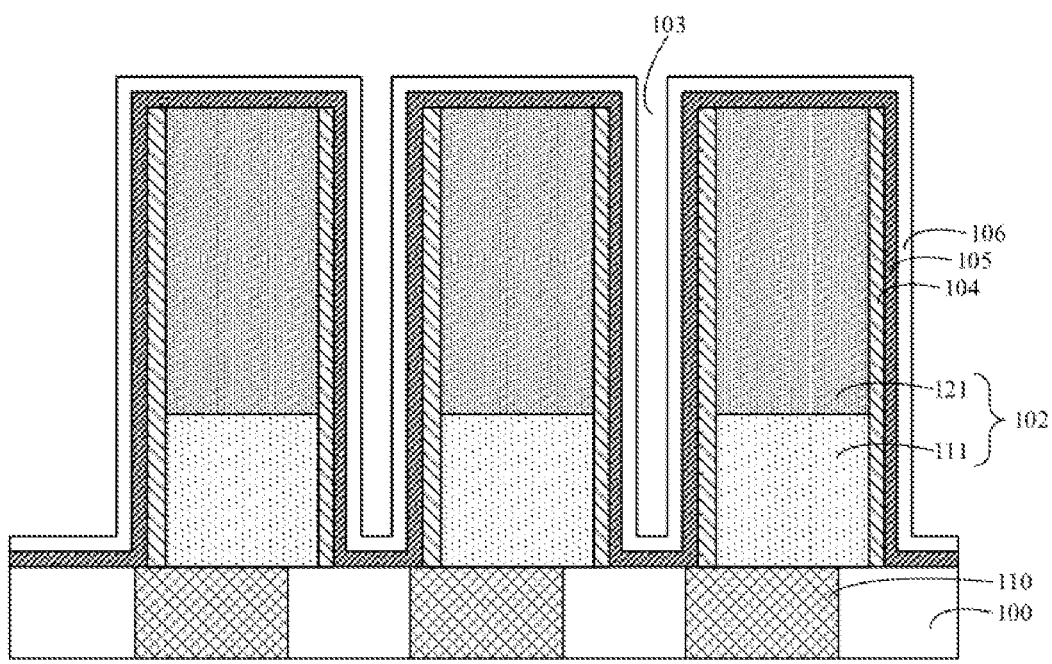
FIG. 10 is a tenth sectional structure diagram of a semiconductor structure corresponding to a step of a method for forming a semiconductor structure according to an embodiment of the disclosure.
Figure 11:
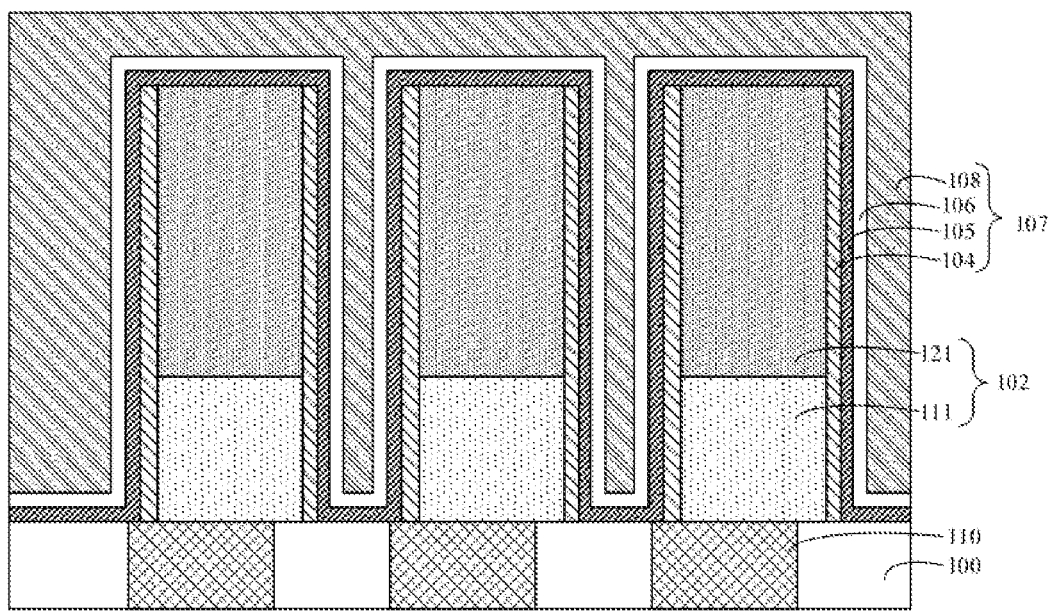
FIG. 11 is an eleventh sectional structure diagram of a semiconductor structure corresponding to a step of a method for forming a semiconductor structure according to an embodiment of the disclosure.

Referring to FIG. 10 to FIG. 11, an upper electrode covering the capacitor dielectric layer 105 is formed. The lower electrode 104, the capacitor dielectric layer 105, and the upper electrode form the capacitor structure 107.

Specifically, the operation that the upper electrode covering the capacitor dielectric layer is formed includes the following operations.

Referring to FIG. 10, a first conducting layer 106 covering the capacitor dielectric layer 105 is formed.

The first conducting layer 106 may be a conducting layer or formed by multiple conducting materials, for example, doped polysilicon, titanium, titanium nitride, tungsten, and a composite of tungsten. In this example, a titanium nitride material is adopted for the first conducting layer 106.

Specifically, the first conducting layer 106 is formed by the atomic layer deposition process or the chemical vapor deposition method. In this example, the first conducting layer 106 is formed by the atomic layer deposition process, and the top conducting layer 106 formed by the atomic layer deposition process is good in coverage. In another example, for example, the first conducting layer may be formed by performing chemical vapor deposition below 500° C. or 600° C.

It is to be noted that the above exemplary description of a specific temperature parameter of chemical vapor deposition is only for ease of understanding of those skilled in the art and not intended to form limits to the solution. In practical applications, all parameters in the abovementioned range shall fall within the scope of protection of the disclosure.

Referring to FIG. 11, a second conducting layer 108 filling a gap between the first conducting layers 106 is formed. A top surface of the second conducting layer 108 is parallel to a top surface of the first conducting layer 106 on the supporting structure 102, and a height of the top surface of the second conducting layer 108 is greater than a height of the top surface of the first conducting layer 106 on the supporting structure 102.

Specifically, a second conducting film (not shown in the figure) filling the gap between the first conducting layers 106 is formed. A height of a top surface of the second conducting film is greater than a height of the top surface of the first conducting layer 106. Chemical mechanical polishing is performed on the top surface of the second conducting film (not shown in the figure) to form the second conducting layer 108.

The chemical mechanical polishing method for removing the second conducting layer 108 is simple in flow and low in cost, and the manufacturing efficiency of the semiconductor structure may be improved effectively. In another example, the second conducting film may be etched to form the second conducting layer. The gaps between the first conducting layer 106 are filled to integrate the discrete capacitor structures 107.

Compared with a process of forming a double-sided capacitor in the related art, the example of the disclosure has the advantages that the stable supporting structures are formed on the semiconductor substrate at first, and the capacitor structures of columnar structures are formed based on the stable supporting structures. Due to the stable supporting structures, a height of a formed columnar capacitors is greatly increased compared with that of the double-sided capacitors, namely the columnar capacitors have a higher aspect ratio. In a process of forming the columnar capacitors, no high-aspect-ratio capacitor hole is required to be formed by etching, so that process steps are simpler, and the cost is reduced. Since no high-aspect-ratio capacitor hole is required to be formed by etching, the stability of the formed capacitor structure is also ensured. In addition, compared with the double-sided capacitor, the columnar capacitor has the advantage that the situation that inner-layer capacitance of the double-sided capacitor is electrically instable is avoided, so that the yield of a semiconductor structure is improved.

The above steps are divided only for clear description. During implementation, the steps may be combined into one step, or some steps may be split into multiple steps, and any solution including the same logical relationship falls within the scope of protection of the disclosure. Adding insignificant modifications to the flow or introducing insignificant designs without changing the core design of the flow falls within the scope of protection of the disclosure.

Another example of the disclosure relates to a method for forming a semiconductor structure. The difference from the abovementioned example is that, in this example, for ensuring the stability of electrical connection between the lower electrode and the conducting layer, a bottom conducting layer is arranged to enlarge an electrical connection area of the lower electrode and the conducting layer. In addition, if the contact area is larger, contact resistance is reduced, and a signal delay of a transistor may also be reduced.

FIG. 12 to FIG. 19 are flowcharts corresponding to each step of a method for forming a semiconductor structure according to an example of the disclosure. The method for forming a semiconductor structure of the example will be specifically described below.

Figure 12:
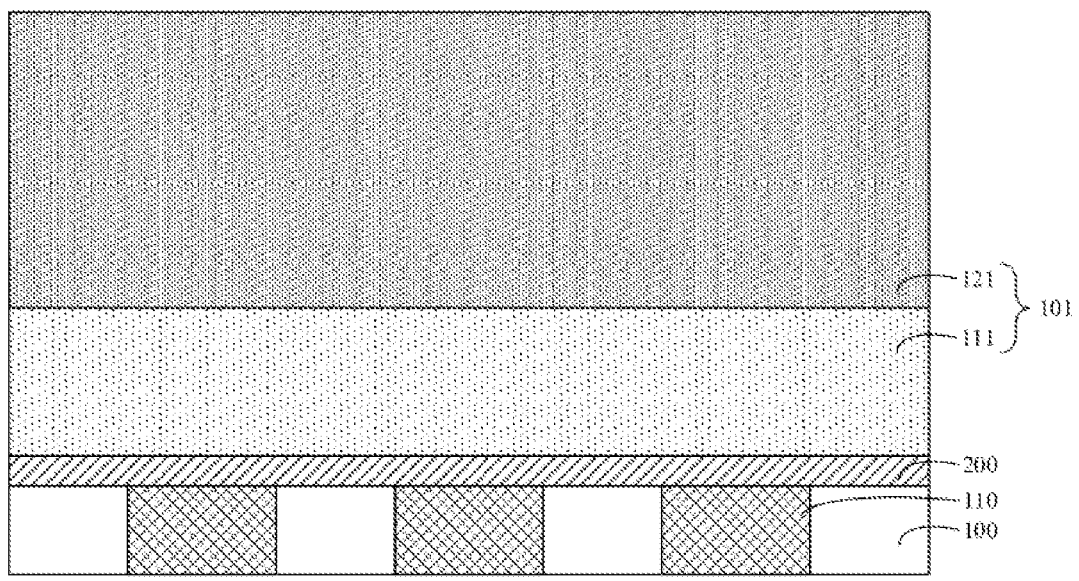
FIG. 12 is a first sectional structure diagram of a semiconductor structure corresponding to a step of a method for forming a semiconductor structure according to another embodiment of the disclosure.

Referring to FIG. 12, compared with the abovementioned example, in this example, before the supporting layer 101 is formed, the following operation is further included: a bottom conducting layer 200 is formed on the semiconductor substrate, and the bottom conducting layer 200 is electrically connected with the conducting layer 110.

Before the supporting structures 102 are formed, the bottom conducting layer 200 is formed on a top surface of the semiconductor substrate 100, and after the supporting structures 102 are formed, the bottom conducting layer 200 is also at a bottom of the supporting structure 102, so that a contact area of the subsequently formed lower electrode 104 and the conducting layer 110 is enlarged, and the stability of electrical connection between the formed lower electrode 104 and the conducting layer 110 is ensured.

Figure 13:
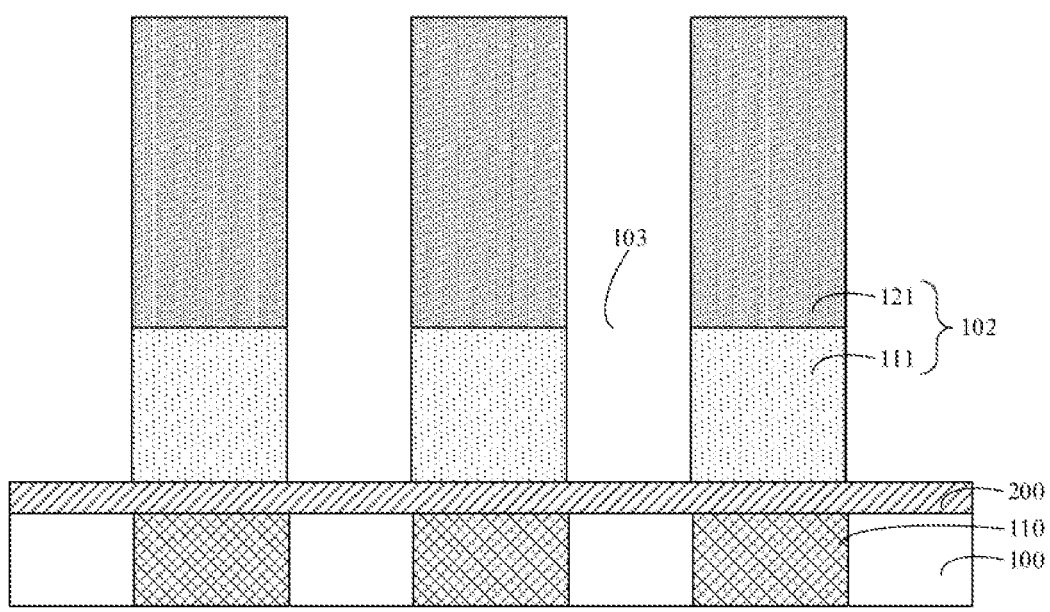
FIG. 13 is a second sectional structure diagram of a semiconductor structure corresponding to a step of a method for forming a semiconductor structure according to another embodiment of the disclosure.
Figure 14:
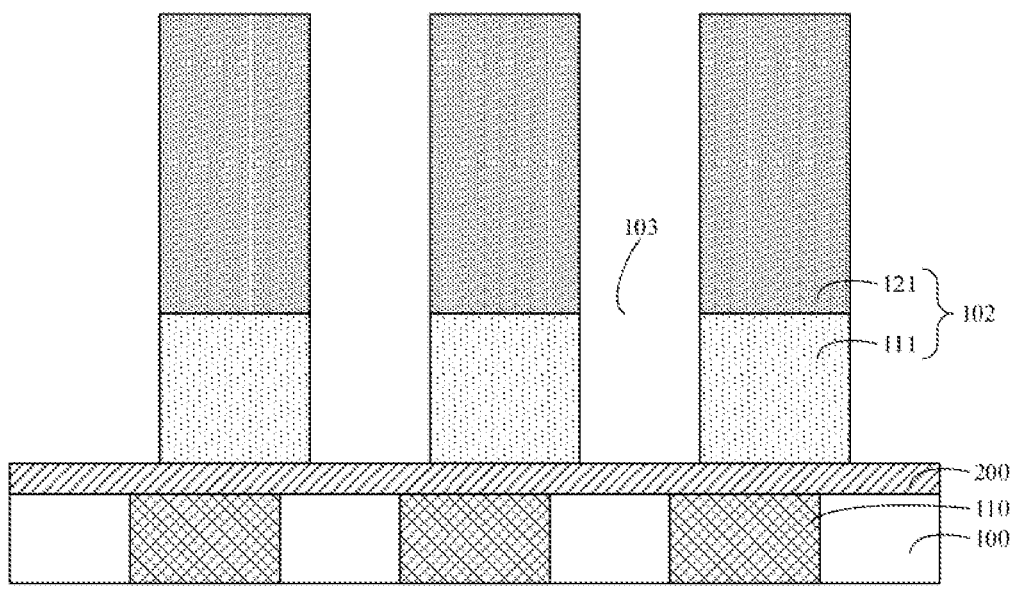
FIG. 14 is a third sectional structure diagram of a semiconductor structure corresponding to a step of a method for forming a semiconductor structure according to another embodiment of the disclosure.

Referring to FIG. 13 and FIG. 14, the discretely arranged supporting structures 102 may be formed on the bottom conducting layer 200. In the example of the disclosure, two positions of the supporting structures 102 are provided, specifically as follows.

The first manner: referring to FIG. 13, the supporting structure 102 is on the bottom conducting layer 200, and a projection of the supporting structure 102 on the semiconductor substrate 100 completely covers a projection of the conducting layer 110 on the semiconductor substrate 100.

The second manner: referring to FIG. 14, the supporting structure 102 is on the bottom conducting layer 200, and there is no overlapping relation between the projection of the supporting structure 102 on the semiconductor substrate 100 and the projection of the conducting layer 110 on the semiconductor substrate 100.

Referring to FIG. 15 to FIG. 18, a subsequent capacitor structure forming process is performed in the example of the disclosure taking the position of the supporting structure 102 in the first manner as an example.

Figure 15:
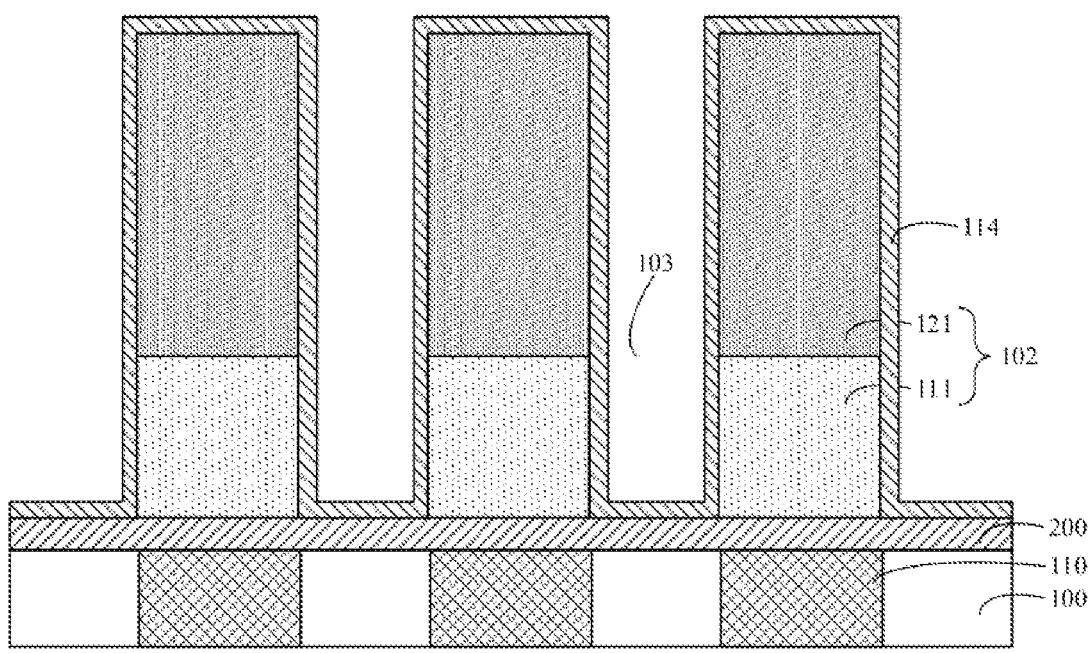
FIG. 15 is a fourth sectional structure diagram of a semiconductor structure corresponding to a step of a method for forming a semiconductor structure according to another embodiment of the disclosure.
Figure 16:
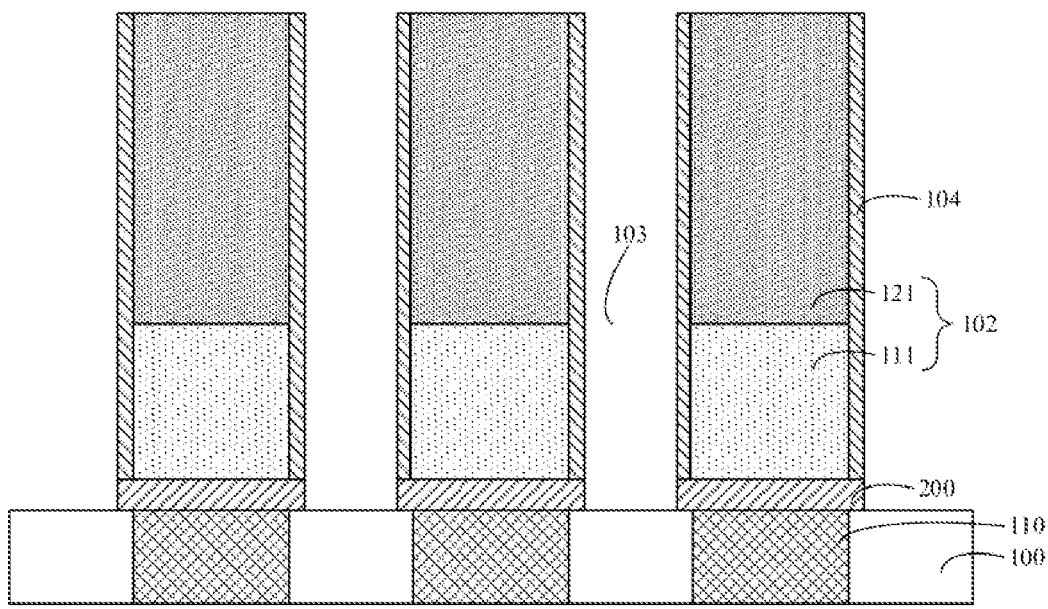
FIG. 16 is a fifth sectional structure diagram of a semiconductor structure corresponding to a step of a method for forming a semiconductor structure according to another embodiment of the disclosure.

Specifically, referring to FIG. 15 and FIG. 16, a lower electrode 104 is formed. The lower electrode 104 is formed on the sidewalls of the supporting structure 102. The lower electrode 104 is electrically connected with the bottom conducting layer 200. After the lower electrode 104 is formed and before the capacitor dielectric layer 105 is formed, the following operation is further included: the bottom conducting layer 200 exposed from the bottom of the capacitor opening 103 is etched away.

Figure 17:
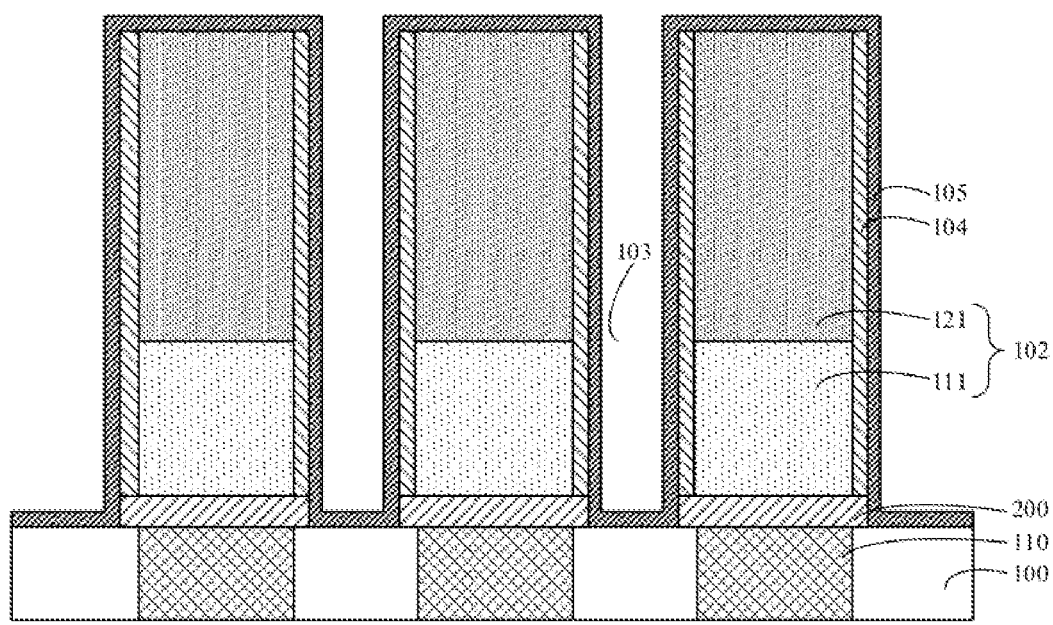
FIG. 17 is a sixth sectional structure diagram of a semiconductor structure corresponding to a step of a method for forming a semiconductor structure according to another embodiment of the disclosure.

Referring to FIG. 17, a capacitor dielectric layer 105 covering the tops of the supporting structures 102, the sidewalls of the lower electrodes 104, and the bottoms of the capacitor openings 103 is formed.

Figure 18:
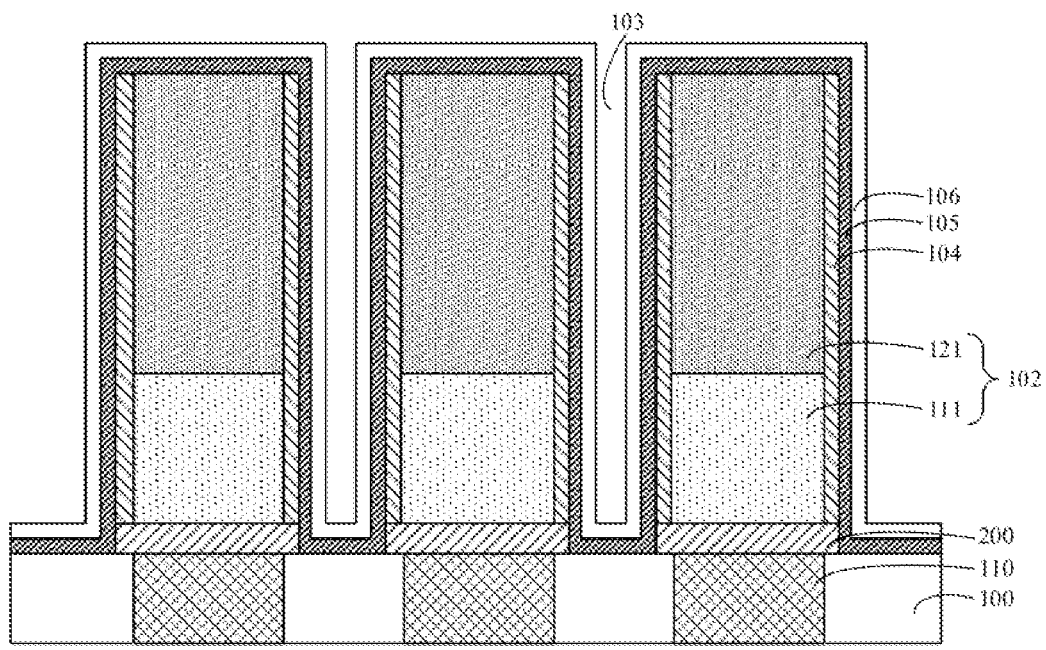
FIG. 18 is a seventh sectional structure diagram of a semiconductor structure corresponding to a step of a method for forming a semiconductor structure according to another embodiment of the disclosure.
Figure 19:
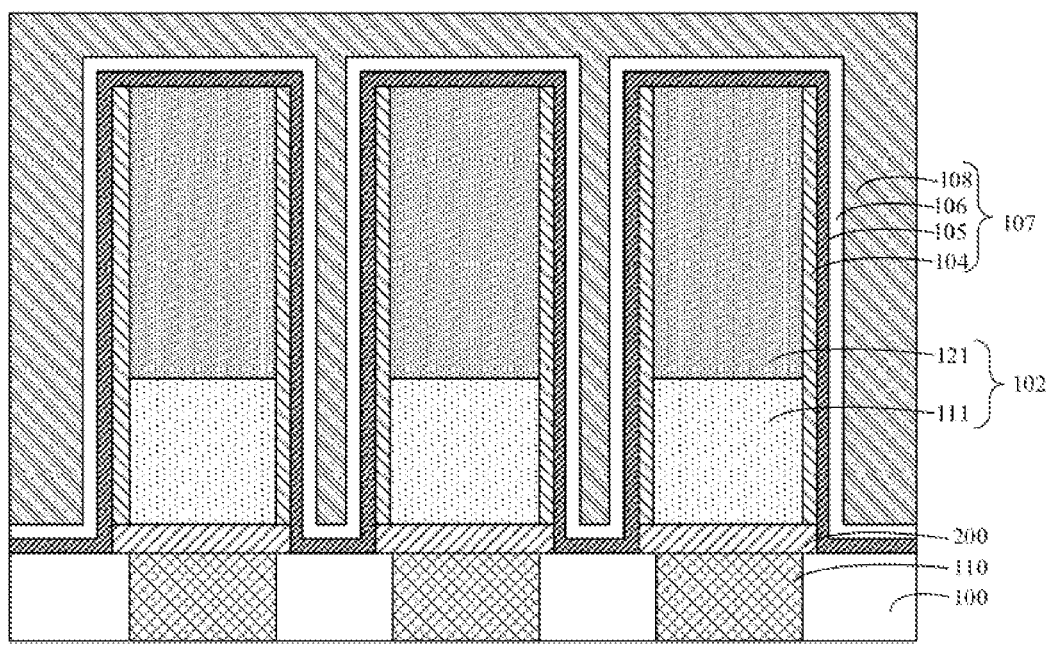
FIG. 19 is an eighth sectional structure diagram of a semiconductor structure corresponding to a step of a method for forming a semiconductor structure according to another embodiment of the disclosure.

Referring to FIG. 18 to FIG. 19, an upper electrode covering the capacitor dielectric layer 105 is formed. The lower electrode 104, the capacitor dielectric layer 105, and the upper electrode form a capacitor structure 107.

Specifically, the operation that the upper electrode covering the capacitor dielectric layer is formed includes the following operations.

Referring to FIG. 18, a first conducting layer 106 covering the capacitor dielectric layer 105 is formed.

Referring to FIG. 19, a second conducting layer 108 filling a gap between the first conducting layer 106 is formed. A top surface of the second conducting layer 108 is parallel to a top surface of the first conducting layer 106 on the supporting structure 102, and a height of the top surface of the second conducting layer 108 is greater than a height of the top surface of the first conducting layer 106 on the supporting structure 102.

Before the supporting structures are formed, the bottom conducting layer is formed on a top surface of the semiconductor substrate, and after the supporting structures are formed, the conducting layer is also located at the bottom of the supporting structure, so that a contact area of the subsequently formed lower electrode and the conducting layer is enlarged, and the stability of electrical connection between the formed lower electrode and the conducting layer is ensured.

Compared with the process of forming a double-sided capacitor in the related art, the example of the disclosure has the advantages that the stable supporting structure is formed on the semiconductor substrate at first, and the capacitor structure of a columnar structure is formed based on the stable supporting structure. Due to the stable supporting structure, a height of a formed columnar capacitor is greatly increased compared with that of a double-sided capacitor, namely the columnar capacitor has a higher aspect ratio. In a process of forming the columnar capacitor, no high-aspect-ratio capacitor hole is required to be formed by etching, so that process steps are simpler, and the cost is reduced. Since no high-aspect-ratio capacitor hole is required to be formed by etching, the stability of the formed capacitor structure is also ensured. In addition, compared with the double-sided capacitor, the columnar capacitor has the advantage that the condition that inner-layer capacitance of the double-sided capacitor is electrically instable is avoided, so that the yield of a semiconductor structure is improved.

In addition, for highlighting innovative parts of the disclosure, units related not so closely to the technical problem to be solved in the disclosure are not introduced in the example, but this does not mean that there are no other structures in the example.

The abovementioned example corresponds to the present example, so that the present example may be matched with the abovementioned example for implementation. The related technical details mentioned in the abovementioned example are still effective in the present example, and the technical effects that may be achieved in the abovementioned example may also be achieved in the present example. For reducing repetitions, elaborations are omitted herein. Correspondingly, related technical details mentioned in the present example may also be applied to the abovementioned example.

The above steps are divided only for clear description. During implementation, the steps may be combined into one step, or some steps may be split into multiple steps, and any solution including the same logical relationship falls within the scope of protection of the disclosure. Adding insignificant modifications to the flow or introducing insignificant designs without changing the core design of the flow falls within the scope of protection of the disclosure.

Another example; of the disclosure relates to a semiconductor structure.

Referring to FIG. 11 and FIG. 19, the semiconductor structure provided in the example will be described below in detail in combination with the drawing. Parts the same as or corresponding to the abovementioned examples will not be repeated below.

The semiconductor structure includes: a semiconductor substrate 100, which at least includes discrete conducting layers 110; multiple discrete supporting structures 102, located on the semiconductor substrate 100; and capacitor structures 107 supported by the supporting structures 102. A capacitor structure 107 includes: a lower electrode 104, located on a sidewall of the supporting structure 102 and electrically connected with the conducting layer 110; a capacitor dielectric layer 105, located at a top of the supporting structure 102, a sidewall of the lower electrode 104, and a bottom of a gap between the supporting structures 102; and an upper electrode, located on the capacitor dielectric layer 105.

An arrangement of the discrete conducting layers 110 in the semiconductor substrate 100 is shown in FIG. 2. The conducting layers 100 are landing pads in a DRAM structure. The conducting layers 110 are arranged hexagonally and configured to electrically connect to array transistors of the DRAM.

The supporting structure 102 provided in this example may be implemented by a stacked structure, and the supporting structure 102 formed by the stacked structure is higher, namely the subsequently formed capacitor 107 has a higher aspect ratio. In another example, the supporting structure 102 may also be implemented by a single-layer structure.

Specifically, the gap between the supporting structures 102 at least exposes a part of a top surface of each discrete conducting layer 110. The lower electrode 104 is configured to connect to the exposed top surface of the discrete corresponding conducting layer 110.

The capacitor structure 107 includes: the lower electrode 104, located on the sidewall of the supporting structure 102 and electrically connected with the conducting layer 110; the capacitor dielectric layer 105, located at the top of the supporting structure 102, the sidewall of the lower electrode 104, and the bottom of the gap between the supporting structures 102; and the upper electrode, located on the capacitor dielectric layer 105.

Each of the lower electrode 104 and the upper electrode may be a conducting layer or formed by multiple conducting materials, for example, doped polysilicon, titanium, titanium nitride, tungsten, and a composite of tungsten. In the example, a titanium nitride material is adopted for the lower electrode 104 and the upper electrode. The capacitor dielectric layer 105 is a material with a high dielectric constant, for example, an element with a high dielectric constant like Hf, La, Ti, and Zr or an oxide thereof, or a dopant of Si and N may be adopted.

In the example, the upper electrode includes a first conducting layer 106 and a second conducting layer 108. The first conducting layer 106 is on the capacitor dielectric layer 105, and the second conducting layer 108 fills a gap between the first conducting layers 106. A height of a top surface of the second conducting layer 108 is greater than a height of a top surface of the first conducting layer on the supporting structure 102.

In an example, referring to FIG. 19, the semiconductor structure further includes a bottom conducting layer 200, located between the semiconductor substrate 100 and the supporting structure 102 and configured to electrically connect the conducting layer 110 and the lower electrode 104. The bottom conducting layer 200 is arranged to enlarge an electrical connection area of the lower electrode 104 and the conducting layer 110, so that the stability of electrical connection between the formed lower electrode 104 and the conducting layer 110 is ensured.

Compared with the capacitor structure of a double-sided capacitor, the capacitor structure of the columnar capacitor is formed based on a stable supporting structure. Due to the stable supporting structure, a height of the columnar capacitor is greatly increased compared with that of the double-sided capacitor, namely the columnar capacitor has a higher aspect ratio. Process operations for forming the columnar capacitor are simpler, and the cost is reduced. Since no high-aspect-ratio capacitor hole is required to be formed by etching, the stability of the capacitor structure of the formed columnar capacitor is also ensured. In addition, compared with the double-sided capacitor, the columnar capacitor has the advantage that the condition that inner-layer capacitance of the double-side capacitor is electrically instable is avoided, so that the yield of the semiconductor structure is improved.

In addition, for highlighting innovative parts of the disclosure, units related not so closely to the technical problem to be solved in the disclosure are not introduced in the example, but this does not mean that there are no other structures in the example.

The abovementioned examples correspond to the present embodiment, so that the present example can be matched with the abovementioned examples for implementation. The related technical details mentioned in the abovementioned examples are still effective in the present example, and the technical effects that may be achieved in the abovementioned examples may also be achieved in the present example. For reducing repetitions, elaborations are omitted herein. Correspondingly, related technical details mentioned in the present example may also be applied to the above-mentioned example.

Those of ordinary skill in the art can understand that each example is a specific example implementing the disclosure, and in practical applications, various variations about the form and details can be made thereto without departing from the spirit and scope of the disclosure.

What is claimed is:

1. A method for forming a semiconductor structure, comprising:
   providing a semiconductor substrate, which at least comprises discrete conducting layers in the semiconductor substrate;
   forming a bottom conducting layer on the semiconductor substrate, the bottom conducting layer being electrically connected with the conducting layers;
   forming discretely arranged supporting structures on the bottom conducting layer, capacitor openings being comprised between the supporting structures;
   forming lower electrodes on sidewalls of the supporting structures, the lower electrodes being electrically connected with the bottom conducting layer;
   etching away the bottom conducting layer exposed from the bottom of the capacitance openings, the bottom conducting layer located only between the semiconductor substrate and the supporting structure;
   forming a capacitor dielectric layer covering tops of the supporting structures, sidewalls of the lower electrodes, and bottoms of the capacitor openings; and
   forming an upper electrode covering the capacitor dielectric layer, to form capacitor structures.

2. The method for forming a semiconductor structure of claim 1, wherein said forming the discretely arranged supporting structures on the semiconductor substrate comprises:
   forming a supporting layer on the semiconductor substrate; and
   patterning the supporting layer to form the capacitor openings, the remaining supporting layer forming the supporting structures.

3. The method for forming a semiconductor structure of claim 2, wherein the capacitor openings at least expose a part of a top surface of each discrete conducting layer.

4. The method for forming a semiconductor structure of claim 1, wherein each of the supporting structures is a stacked structure formed by sequential stacking.

5. The method for forming a semiconductor structure of claim 4, wherein the stacked structure comprises a bottom supporting layer and a filling layer that are formed by sequentially stacking.

6. The method for forming a semiconductor structure of claim 2, wherein said patterning the supporting layer to form a plurality of discrete capacitor openings comprises:
   sequentially forming a mask layer and a patterned photoresist layer on the supporting layer;
   patterning the mask layer based on the photoresist layer; and
   etching the supporting layer based on the patterned mask layer to form the capacitor openings.

7. The method for forming a semiconductor structure of claim 1, wherein said forming the lower electrodes electrically connected with the bottom conducting layer on the sidewalls of the supporting structures comprises:
   forming a top conducting layer on the tops and sidewalls of the supporting structures and the bottoms of the capacitor openings; and
   removing the top conducting layer on the tops of the supporting structure and the bottoms of the capacitor openings to form the lower electrodes on the sidewalls of the supporting structures.

8. The method for forming a semiconductor structure of claim 7, wherein a process for removing the top conducting layer on the tops of the supporting structures comprises chemical mechanical polishing.

9. The method for forming a semiconductor structure of claim 1, wherein said forming the upper electrode covering the capacitor dielectric layer comprises:
   forming a first conducting layer covering the capacitor dielectric layer; and
   forming a second conducting layer filling gaps between the first conducting layer, a top surface of the second conducting layer being parallel to a top surface of the first conducting layer on the supporting structure, and a height of the top surface of the second conducting layer being greater than a height of the top surface of the first conducting layer on the supporting structure.

10. The method for forming a semiconductor structure of claim 9, wherein said forming the second conducting layer filling the gaps between the first conducting layer comprises:
    forming a second conducting film filling the gaps between the first conducting layer, a height of a top surface of the second conducting film being greater than a height of the top surface of the first conducting layer on the supporting structure; and
    performing chemical mechanical polishing on the top surface of the second conducting film to form the second conducting layer.

11. A semiconductor structure, comprising:
    a semiconductor substrate, wherein at least discrete conducting layers are comprised in the semiconductor substrate;
    multiple discrete supporting structures, located on the semiconductor substrate; and
    capacitor structures supported by the supporting structures, wherein each capacitor structure comprises:
    a lower electrode, located on a sidewall of a corresponding one of the supporting structures;
    a bottom conducting layer, located only between the semiconductor substrate and the supporting structure and configured to electrically connect the lower electrode and the conducting layer; wherein the supporting structure is on the bottom conducting layer;
    a capacitor dielectric layer, located at a top of the supporting structure, a sidewall of the lower electrode, and a bottom of a gap between the supporting structures; and
    an upper electrode, located on the capacitor dielectric layer.

12. The semiconductor structure of claim 11, wherein gaps between the supporting structures at least expose a part of a top surface of each discrete conducting layer; and the lower electrode is configured to connect to the exposed top surface of the discrete conducting layer.

13. The semiconductor structure of claim 11, wherein the upper electrode comprises:
    a first conducting layer, located on the capacitor dielectric layer; and
    a second conducting layer, filling gaps between the first conducting layer, a height of a top surface of the second conducting layer being greater than a height of a top surface of the first conducting layer on the supporting structure.

* * * * *